United States Patent [19]
Wickersham

[11] 4,232,928
[45] Nov. 11, 1980

[54] APPARATUS EMPLOYING FLEXIBLE DIAPHRAGM FOR EFFECTING SUBSTANTIALLY UNIFORM FORCE, INDIVIDUAL COUPLINGS WITH MULTIPLE ELECTRICAL CONTACTS OR THE LIKE

[75] Inventor: Price D. Wickersham, Shawnee Mission, Kans.

[73] Assignee: DIT-MCO International Corporation, Kansas City, Mo.

[21] Appl. No.: 52,605

[22] Filed: Jun. 27, 1979

[51] Int. Cl.$^3$ ............................................. H01R 4/64
[52] U.S. Cl. .............................. 339/117 P; 324/73 R; 324/158 P
[58] Field of Search .......... 339/117 P, 18 R, 176 MP; 324/73 R, 74 PC, 158 P, 158 F

[56] References Cited
U.S. PATENT DOCUMENTS

| 2,978,666 | 4/1961 | McGregor | 339/117 P X |
| 3,016,489 | 1/1962 | Briggs et al. | 324/73 R X |
| 3,757,219 | 9/1973 | Aksu | 324/158 P X |
| 3,970,934 | 7/1976 | Aksu | 324/158 P X |
| 4,061,969 | 12/1977 | Dean | 324/73 R X |
| 4,164,704 | 8/1979 | Kato et al. | 324/158 P X |

Primary Examiner—Mark Rosenbaum
Assistant Examiner—DeWalden W. Jones
Attorney, Agent, or Firm—Schmidt, Johnson, Hovey & Williams

[57] ABSTRACT

Apparatus having special utility for the electrical interfacing of multi-terminal circuit testing equipment to multi-contact printed circuit boards or the like employs a fluid pressure responsive, resiliently flexible diaphragm for controllably effecting concurrent, individual, substantially equal force engagements between shiftable, rigid contacting elements and corresponding stationary contact points on the unit to be tested, despite possible lack of precise co-planarity of such contact points. The arrangement is space conserving and permits the elimination of expensive and troublesome spring contact pins, the utilization of desirable wire-wrap connection techniques in fabricating interfacing assemblies, and the convenient disposition of all points of electrical contact with both the testing equipment and the unit under test at one side of the interfacing assembly. The apparatus would appear also adapted for useful application in various other environments where controlled electrical connections must be concurrently made with substantially equal engagement forces to each of a sizeable plurality of electrical contacts, or even where such separate, substantially equal force engagements with a plurality of contactable structures are themselves the desired primary function to be accomplished, rather than the making of electrical connections thereto. The fluid pressure differential used to control the action of the diaphragm may be created by evacuation of a sealed chamber or by pressurization of a sealed chamber and the latter either through fluid or mechanical techniques.

7 Claims, 5 Drawing Figures

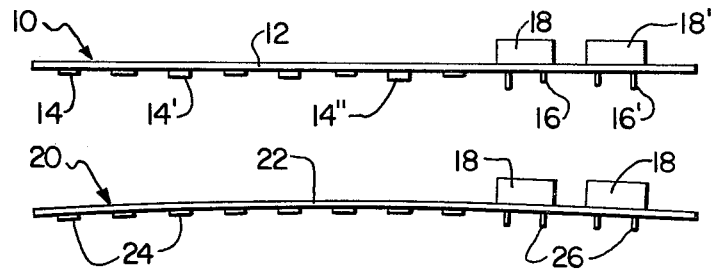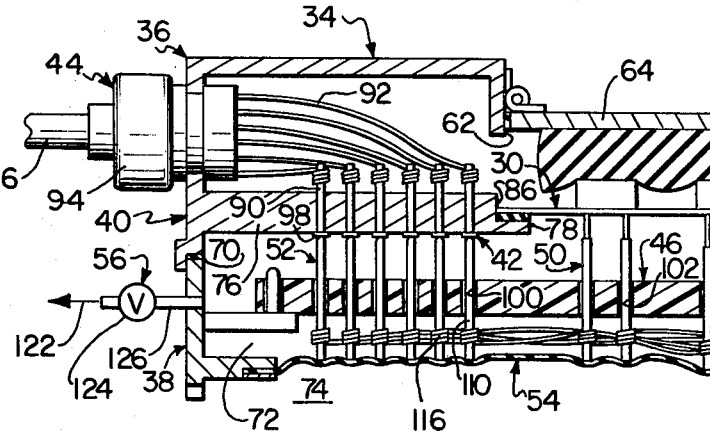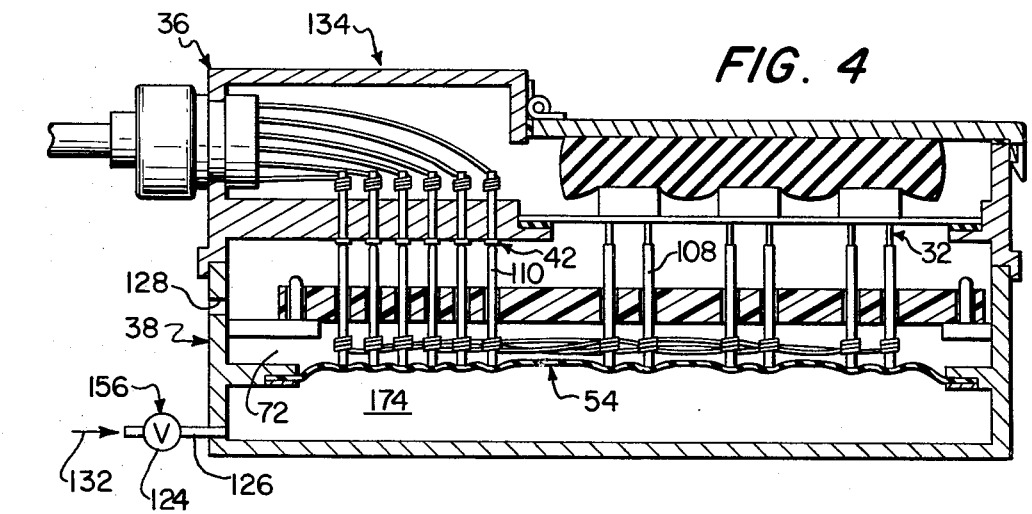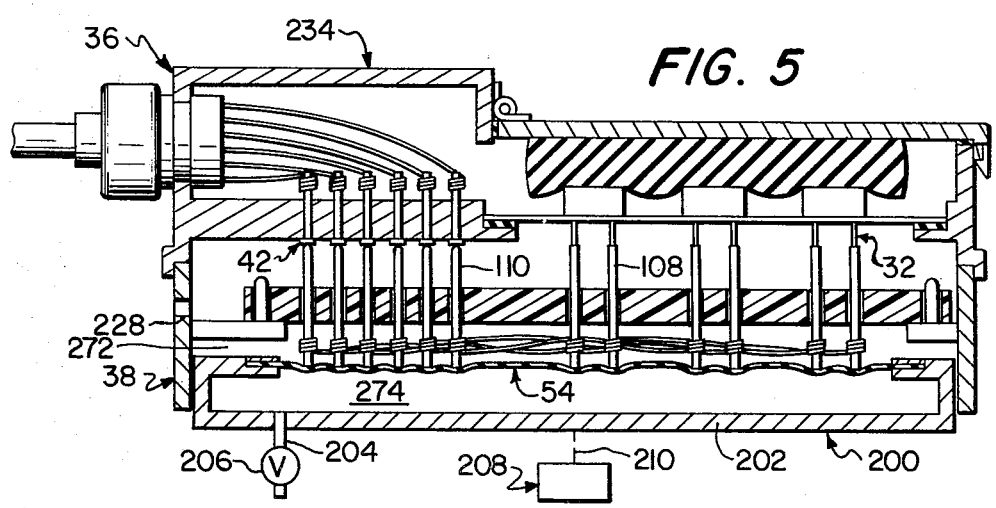

APPARATUS EMPLOYING FLEXIBLE DIAPHRAGM FOR EFFECTING SUBSTANTIALLY UNIFORM FORCE, INDIVIDUAL COUPLINGS WITH MULTIPLE ELECTRICAL CONTACTS OR THE LIKE

BACKGROUND OF THE INVENTION

1. Field of the Invention

In the context of the preferred and modified embodiments chosen for illustrating the invention, it relates to improved apparatus for concurrently effecting controlled separate electrical connections to a permissably numerous plurality of permissably densely arranged contact points, such for example as the multitudinous contact structures representing test points on an electronic printed circuit board to be tested (all of which typically must be contacted simultaneously during testing), and for doing so in manner which also facilitates electrically coupling each of such connections with the corresponding terminals of circuit testing equipment or the like.

In a somewhat broader context, the invention is concerned with providing improved means employing a preferably resilient, flexible diaphragm and a fluid pressure differential for simultaneously, but independently, urging a plurality of rigid, pin-like contacting elements into respective engagement with a corresponding plurality of contactable structures with substantially equal forces, thereby also effecting separate electrical connections with each of such structures when such elements are formed of electrically conductive material and such diaphragm is formed of electrically non-conductive material.

Thus, in terms of the applications for which the embodiments of the invention described herein for illustrative purposes were developed, the field of the invention is the art of electrical interconnect systems employed for the testing of single or multilayer, printed circuit boards or the like, with particular emphasis upon the effectuation of electrical connections between the electrical terminals of the "wiring or circuit analyzer" or other testing equipment and the electrical test point terminals of the units to be tested. Those skilled in the electrical and mechanical arts should recognize, however, that the principles and the structural and functional aspects of the invention may also have significant utility in diverse other applications involving the effectuation of substantially equally forceful, separate, respective engagements with a plurality of individually contactable structures, for purposes of effecting independent electrical connections with the latter or otherwise, especially whenever the zones of engagement are numerous or closely spaced or when it is desirable for economic, reliability or other reasons to effect such engagements through simple rigid pins rather than spring-biased compressible elements.

2. Description of the Prior Art

The electrical testing of printed circuit boards and similar electronic modules in commercial quantities is typically carried out with the use of circuit testing equipment which may be controlled or programmed to sequentially apply appropriate energizing signals to various electrical contact structures or test points on the units to be tested, to sense the resulting electrical parameters between those or at other of such test points, and to detect and indicate or record any faults in the characteristics of the various portions of the internal circuitry of the tested units (e.g., open circuit paths, short circuits, unintended leakage paths or other static or dynamic conditions). Since a number of similar units are normally to be successively tested, it is necessary to provide some means for quickly and conveniently effecting and releasing electrical connections between the terminals of the testing equipment and the appropriately related test points of each of the successive units to be tested, that matter being complicated by the normally multi-terminal nature of both (hundreds or even thousands of terminals being typical) and the fact that the test points on the units to be tested will typically be arranged in a relatively dense and more or less arbitrary pattern.

Conventional prior practice in effecting such electrical connections between the terminals of the circuit testing equipment and the test point contact structures of a succession of printed circuit boards or the like of a given type to be tested has been to provide a fixture for successively receiving the units to be tested, with the unique pattern of test points of the latter in spaced, facing relationship to an array of contacts respectively electrically connected with the terminals of the testing equipment and relatively movable with respect to the unit to be tested for effectuation of electrical connections with each of the test points of the unit under test in one of the ways next described.

In applications in which a given piece of testing equipment and the associated fixture may economically be dedicated to the testing of very large quantities of identical printed circuit boards or the like on a continuing or relatively long term basis, it may be feasible to arrange the array of contacts provided by the fixture and associated with the terminals of the testing equipment in the same unique pattern as the locations of the test points on the units to be tested to permit making connections therebetween responsive to relative movement of such contacts of the fixture and the unit under test toward each other. Even in those instances, however, it has normally been found necessary to effect such connections between the contacts associated with the terminals of the testing equipment and the test points on the unit under test by means of electrically conductive, springbiased, compressible connection pins, which may be either utilized as the contacts associated with the terminals of the testing equipment and more or less permanently wired to or otherwise coupled with the latter or by employing such spring-biased pins intermediately between the contacts associated with the testing equipment and the test points of the unit under test. In the latter type of arrangement, the intermediately disposed, spring-biased, connection pins typically would be supported by an apertured plate or the like having pin receiving holes aligned along the axes extending between each contact associated with the testing equipment and a corresponding test point on the unit to be tested.

In what is believed to constitute the majority of practical applications for such circuit testing arrangements, however, there will be only a more limited number of printed circuit boards or the like of each of a continuing variety of types to be tested over relatively shorter periods so that it is economically impractical to exclusively dedicate a given piece of circuit testing equipment to the testing of only a single type of printed circuit board or the like; and it is, therefore, not feasible to provide merely a single fixture and interfacing arrangement of the type last described with any given piece of circuit testing equipment. In fact, it is commonly required that a given piece of circuit testing equipment may be employed for testing different specific types of printed circuit boards or the like from time to time as commercial circumstances may demand. Effort has been made to cope with the last-mentioned problem by providing the fixture with a "standard" array of contacts which are more or less permanently coupled with the respective terminals of the testing equipment and which are arranged in a regular grid or matrix pattern with the contacts on uniformly spaced Cartesian coordinates typically 1/10 inch apart, and employing therewith a plurality of differing types of electrical interfacing assemblies, often called "transition boxes", with a differently arranged interfacing box being required with each type of printed circuit board or the like to be tested in order to provide contacting structures properly aligned with the typically irregularly patterned arrangement of test points on each particular type of units to be tested. Such boxes must electrically interface on one side thereof with the regularly arranged contacts of the matrix associated with the terminals of the testing equipment, while electrically interfacing on the opposite side thereof with the irregularly arranged pattern of test points on the particular type of units in whose testing such boxes are to be respectively employed; this dual and opposite interfacing essentially accomplishes a coordinate transformation between the contacts of the permanent matrix and the unique patterns of test points of the particular type of unit to be tested for which the board was designed. Since such interfacing assemblies must provide for effecting electrical connections between contacts associated with the testing equipment and logically corresponding test points on the unit to be tested which may be laterally offset with respect to such contacts, there have been a substantial variety of constructions proposed or employed for fabricating such transition boxes. By virtue of the common employment of fixtures depending upon relative movement between the array of contacts associated with the testing equipment and the unit under test, which are usually disposed in physical opposition to each other, in order to effectuate the required electrical connections therebetween, as well as the known tendency of some contacts in arrays thereof to significantly deviate from precise co-planarity with others, however, such interfacing assemblies have predictably heretofore utilized spring-biased, compressible, electrically conductive, intermediate connecting pins for effecting engagement type connections with the contacts associated with the testing equipment, the test points of the unit under test or both. In a typical transition box, one set of spring pins faces the array of contacts associated with the testing equipment, another set of spring pins oppositely faces the test points of the unit under test, and corresponding pins of such oppositely facing sets are hand wired together therebetween.

Experience in utilizing various types of the sort of conventional arrangements heretofore available, however, has revealed various shortcomings and limitations thereof. Many of the disadvantages of such prior arrangements are largely traceable to what has previously been the apparent necessity for using spring-biased, compressible type connecting pins, as well as the assumption that the transition box should be deployed between the contact array associated with the testing equipment and the test points of a physically opposed unit to be tested. Because of their relatively small size and the nature of their construction, such spring-biased connection pins are quite expensive, as is the task of providing hand-wired jumpering between oppositely facing sets thereof.

The overall problem is compounded by the substantial number of spring-biased pins required in each conventional transition box, the attendant statistical probability of failure of at least a few spring-biased pins in any given box after substantial use of the latter, the fact that such an interfacing assembly can no longer be used after failure of even a single spring-biased pin without adversely affecting the testing being performed or possibly damaging the unit being tested, and the difficulty, time and expense in attempting to replace defective spring-biased pins and their jumpering connections in an interfacing assembly requiring a great number of such pins in closely spaced relationship. The assumption that transition boxes must be physically disposed between the contact array associated with the testing equipment and the unit under test and, therefore, employ oppositely facing sets of connector pins, has led to further unnecessary expense and inconvenience in the design, fabrication and utilization of fixtures and interfacing assemblies for the mentioned purpose, and has incidentally resulted in failure of prior apparatus of such general class to effectively take advantage of the cost and other advantages of the technique of so-called "wirewrap" connection of electrically conductive leads, which is now in such common use in many other areas of electrical apparatus. The regretable fact of the matter is that proper testing of many types of relatively low quantity printed circuit modules and the like is simply foregone due to the objectionably high cost of fabricating conventional transition boxes for testing such units.

Another disadvantage of using spring-biased, compressible connector pins is that, although they do provide compliance for compensating to some extent for lack of co-planarity between the various contacts to be engaged, they do so in a non-linear fashion dependent upon the amount of compression induced by the "height" of each individual contact, which results in differing forces of individual contacting engagement with the various contacts. At the level of forces typically employed in such applications, the engagement with some contacts may be inadequate for optimum electrical connections being effected, and, if all of the spring strengths are increased to avoid that, their aggregate forces may damage units being tested.

SUMMARY OF THE INVENTION

Accordingly, one of the primary objects of the invention relates to the provision of improved fixture and interfacing board apparatus for the controlled electrical interconnection of electrical circuit testing equipment with the test points of printed circuit boards or the like to be tested, which eliminates the need for employing spring-biased, compressible connecting pins, as well as oppositely facing sets thereof, and the attendant expense and other disadvantages of such conventional constructions.

In thus improving such apparatus, however, the invention accomplishes a number of other important results including general simplification of structure required, reduction of fabrication time and expense, enhancement of reliability and useful life, permitting both the contacts associated with the testing equipment and the unit being tested to be located on the same "side" of the interfacing board, effective utilization of "wire-wrap" electrical connection techniques in such class of apparatus, and, perhaps most significantly, the novel application of a fluid-pressure-differential-responsive, resiliently flexible diaphragm as the controlled actuator for urging a plurality of permissably densely spaced, rigid, elongate pins into substantially equally forceful, separate engagement with a plurality of permissably non-coplanar contact structures or the like, for purposes of effecting respective electrical connections with the latter or otherwise.

Briefly summarized, the improved apparatus provided by the invention for accomplishing the electrical interfacing function for which the preferred and other embodiments disclosed for illustrative purposes are intended, involves: a fixture embodying a grid-like matrix of uniformly spaced contacts respectively coupled with the terminals of circuit testing equipment, and means for supporting a printed circuit board or the like to be tested in laterally offset relationship to such matrix and with the test point structures on such board facing in the same direction as the contacts of such matrix; an interfacing board assembly including an electrically insulative plate, a first plurality of rigid, electrically conductive connector pins extending through such plate in alignment with the test points of a unit disposed for being tested and reciprocable toward and away from the latter: a second plurality of rigid connector pins laterally offset from the first, extending through such plate in alignment with at least selected contacts of such matrix, and reciprocable toward and away from the latter; a plurality of electrically conductive leads oppositely wirewrap connected between corresponding ones of the first and second pluralities of connector pins according to the desired electrical relationship between particular test points of the type of units to be tested and particular terminals of the testing equipment; a flexible diaphragm in the fixture adjacent the ends of the connector pins on the "side" of the interfacing board opposite from the matrix and the unit to be tested; and suitable means for creating a greater relative fluid pressure on the face of the diaphragm facing away from the interfacing board than on the face thereof adjacent to the latter to shift the diaphragm in the direction of the connector pins to urge the latter into engagement with the test points of the unit under test and the contacts of the matrix with substantially equal forces. The means employed to create such fluid pressure differential may employ a vacuum on the "side" of the diaphragm adjacent the interfacing board or a positive pressure on the opposite "side" thereof, and the latter may be produced either by fluid or mechanically oriented techniques. It should be significantly noted that various subcombinations of the mentioned primary elements appear both novel and likely to have substantial potential utility for employment in possibly diverse applications other than the one chosen for illustration of the advantages of the fuller embodiments hereinafter more fully described.

BRIEF DESCRIPTION OF THE DRAWING

In the drawing:

FIG. 1 is a somewhat schematic side elevational view of a hypothetical and overly-simplified printed circuit board or similar electronic module, in which the scale of deviations of certain contact structures from co-planarity are exaggerated to facilitate certain further background discussion hereinafter;

FIG. 2 is a somewhat schematic, side elevational view of another hypothetical and overly-simplified circuit board or the like, in which the scale of warpage is exaggerated for the same purpose as in FIG. 1.

FIG. 3 is a schematic representation, primarily in vertical cross-section, showing the primary elements and relationships involved in the embodiment of invention which is currently preferred for use in electrically interfacing a printed circuit board or the like to circuit testing equipment:

FIG. 4 is a schematic representation, similar to FIG. 3, but showing an alternative embodiment of the invention; and FIG. 5 is a schematic representation, also similar to FIG. 3, but showing another alternative embodiment of the invention.

DESCRIPTION OF THE INVENTION

Further Background

The nature, operation and advantages of the embodiments to be more specifically described as illustrating the application of the invention to the particular problem for which the invention was initially developed, i.e., the improved effectuation of electrical interfacing connections between multi-terminal testing equipment and multi-terminal printed circuit boards or the like to be successively tested, should be clarified by first considering FIGS. 1 and 2 depicting the general attributes and, by exaggeration, certain configurational deficiencies which may occur in printed circuit boards or portions thereof.

In FIG. 1, the numeral 10 generally designates a somewhat over-simplified representation of a printed circuit board unit or portion thereof having a relatively thin, single or plural layered panel 12 formed of electrically insulative material and bearing a myriad of thin, electrically conductive, circuit paths (not shown) provided at numerous, electrically significant locations thereof with electrically conductive pads, as at 14, 14' and 14", presenting test points upon one face of the panel 12 to which respective electrical connections may be made during testing of the unit 10. Although not so illustrated in FIG. 1, it will be understood that the pads 14 etc., of which there typically will be at least hundreds on a complete unit 10, are generally arranged in an irregular pattern having non-uniform spacings therebetween dependent upon the arrangement of circuit paths in the particular type of unit 10 involved. What is illustrated and exaggerated for emphasis is that the end faces of the pads 14 etc. are not normally precisely co-planar. Such deviations from co-planarity created during fabrication of units 10 may occur in either direction from a median plane and be attributable to differences in thicknesses of the various pads 14 etc. even when the panel 12 is flat and of uniform thickness (as illustrated) or to variations in thickness of the panel 12 or to a combination of both. Since electrical connections with the pads 14 etc. must be effected as a practical matter during testing of successive units 10 by releasable engagements therewith, however, such deviations of the faces of the pads 14 etc. from co-planarity are quite significant when electrical interfacing thereto is undertaken. More specifically, a co-planar array of relatively fixed contacting elements cannot be employed to effect respective engagements with the various pads 14 etc., because "lower" pads 14 etc. either would not be engaged at all or, if the mechanical force of closure was sufficiently increased to assure engagement with all of the pads 14 etc., the engagement forces with some of the "higher" pads 14 etc. would be likely to damage the latter or the relatively delicate unit 10 as a whole. This is, of course, at least in large measure responsible for the conventional use of spring-biased, compressible, contacting pins, which suffer from their own functional disabilities in this context, due to their inherent exertion of differing engagement forces dependent upon the degree of compression occasioned by the sense and extent of deviation from co-planarity of the particular pads 14 etc. being contacted, with resultant variation in the electrical resistance of the connections being effected or the extent of physical forces being applied to areas of the unit 10 or both.

Many printed circuit board units 10 are at least initially tested for open circuit paths, short circuits, unintended electrical leakage paths and the like prior to the mounting of discrete components such as integrated circuit modules upon the panel 12, in which case the contact structures comprising the test points to be simultaneously engaged will typically be a multitude of pads 14 etc. as previously described. However, electronic units 10 may also be tested in a more fully assembled state permitting evaluation of dynamic operating characteristics, in which some or all of the test points on the unit 10 to be engaged by interfacing elements are presented by terminal pins as at 16, 16' of discrete components as at 18, 18' mounted on the panel 12. Components 18 etc., of which there may typically be at least several dozen on a unit 10, in turn each may have as many as several dozen terminal pins 16 etc. Like the pads 14 etc., the pins 16 etc. typically exhibit significant deviations from co-planarity of the ends thereof to be contacted by interfacing elements, due to variations occurring during fabrication of the components 18 etc. or mounting of the latter on the panel 12 or both. The considerations applicable to such lack of co-planarity of pins 16 etc. are essentially analogous to those previously noted in connection with the pads 14 etc., it being observed in passing that the arrangement of the pins 16 etc. shown in FIG. 1 illustrates the irregular patterning of test points typical in most units 10 and such Figure further illustrates that the test points in a unit 10 may include both pads 14 etc. and pins 16 etc.

FIG. 2 illustrates another commonly encountered problem. The electronic unit 20 represented therein may otherwise be analogous to the unit 10 previously described, but involves warpage or lack of planarity in all or a part of the printed circuit board panel 22 itself. The warpage of panel 22 is exaggerated to emphasize that, even assuming the pads 24 to be of uniform thickness, the pins 16 to be of uniform length and the components 18 to be of uniform length and the components 18 to be uniformly mounted on the panel 22, a distinct lack of co-planarity between the test point structures to be engaged by interfacing elements will exist, with consequences comparable to those discussed in connection with FIG. 1. Those experienced in the particular field under consideration will appreciate that the above-noted conditions may occur in various combinations to further compound the problems to be overcome in accomplishing electrical interfacing with electronic modules to be tested. They will also recognize that similar problems may arise from wear or lack of close tolerances even with matrix arrays of multiple electrical contact structures such as are commonly employed in testing fixtures and associated with the terminals of the testing equipment.

Although not specifically depicted, those skilled in the art will be aware that test points on a unit 10 may also involve flat conductor surfaces, pads having holes therethrough which are contacted at the periphery of the hole, the ends of wirewrap pins, etc., in various combinations, which may further contribute to lack of co-planarity between test points due to the inherent design of a unit 10.

The Preferred Embodiment

Reference is next made to FIG. 3, wherein the currently preferred embodiment of the invention adapted for employment in the circuit module testing application chosen for illustrating the principles of the invention is somewhat schematically shown, particularly in the sense that over-simplification of iterated aspects of both the apparatus and the unit to be tested was necessary for clarity or feasibility of depiction, that relative sizing of illustrated parts was accomodated to considerations of clarity rather than to actual scale, and that minor details of mechanical construction, which are not a facet of the inventive subject matter and should be apparent to those skilled in the art of fabircating testing fixtures, are omitted for better illustration of the parts of the apparatus more relevant to the invention.

The apparatus of FIG. 3 for use in testing a printed circuit board unit 30 or the like having an irregular pattern of contact structures 32 presenting test points is generally designated 34 and broadly includes: a fixture housing 36 having a lower section 38 and an upper section 40 provided with means hereinafter described for receiving and supporting the unit 30 and with a fixed grid-like matrix of contact structures 42 coupled with an adaptor cable 44 adapted for connection with testing equipment (not shown); an interfacing board assembly 46 received and supported within the lower section 38 and having a guide plate 48 for reciprocably supporting a plurality of contacting structures 50 respectively aligned with the contact structures 32 of the unit 30 and another plurality of contacting structures 52 respectively aligned with the contact structures 42; a flexible diaphragm 54 carried by the lower section 38 adjacent the lower ends of the contacting structures 50 and 52; and means 56 for creating a fluid pressure differential on opposite sides of the diaphragm 54, which in such preferred embodiment is a vacuum system coupled with the interior of the housing 36.

The unit 30 to be tested is shown for simplicity of illustration as being of a type having discrete components 58, such as integrated circuit packages, mounted on the panel 60 thereof, so that the contact structures 32 to be engaged as test points of the unit 30 appear as in the nature of terminal pins of such components 58, which are exaggeratedly depicted as of unequal length. It will be understood, however, that the test points of the unit could just as well comprise contact pads (such as at 14 etc. in FIG. 1) or a combination of both such pads and component terminal pins or the like. It should also be observed that engagable ends or surfaces of the contact structures 32 need not be even normally co-planar with the engagable surfaces of the contact structures 42, since the lengths of the contacting structures 50 may differ from those of the contacting structures 52 in the interfacing assembly 46 for any given type of unit 30 and either may be chosen so as to easily accommodate for any such disparity inherent from the nature of the particular type of units 30 to be handled by such assembly 46.

During the testing of successive units 30 of a given type, it is necessary to emplace and remove units 30 within the housing 36; and, to that end, the upper section 40 is provided with an opening 62 of sufficient size for the purpose, which is equipped with a closure 64, such as a hinged door, as well as with suitable seals as at 66 and latching means 68 for reasons hereinafter noted. Similarly, when the employment of the apparatus 34 is to be shifted from the testing of units 30 of one type to the testing of units 30 of another type, it will normally be necessary to remove the previous assembly 46 and replace it with a different one designed for the next type of units 30 to be tested; and, to that end, the lower and upper housing sections 38 and 40 are constructed so as to be conveniently relatively shiftable, such as by mounting the upper section 40 on the lower section 38 by means of hinging (not shown), as well as again equipped with suitable seals as at 70. The reason for providing the seals 68 and 70 is to render the interior of the housing 36 a closed chamber for sustaining the fluid pressure differential between the spatial zone 72 above the diaphragm 54 and the spatial zone 74 therebelow utilized during operation, as hereinafter more fully explained.

The upper housing section 40 has a lower wall 76 provided with an aperture 78 therethrough for exposing the contact structures 32 of a unit 30 under test to the upper ends of the corresponding contacting structures 50. The unit 30 under test is supported above the aperture 78 in any suitable fashion, such as upon a ledge 80 formed in the wall 76 about the perimeter of the aperture 78. The unit 30 under test is held down upon the ledge 80 by a yieldable, electrically non-conductive pad 82 formed of plastic foam material or the like secured to the bottom of the closure 64, and a yieldable, non-conductive gasket 84 is provided between the ledge 80 and the unit 30 to protect the edges of the panel 60 of the latter. For simplicity of illustration, the means for assuring proper lateral registration of the unit 30 under test with the contacting structures 50 is shown as being accomplished by appropriate dimensioning of the vertical surface 86 adjacent the ledge 80 to confiningly accommodate the panel 60 of the unit 30, as when the panels 60 of all types of units 30 to be tested are expected to have the same lateral dimensions; however those skilled in the art will appreciate that other conventional means for accomplishing lateral registration of the units 30 may be used, particularly where the lateral dimensions of the panels 60 of the types of units 30 to be tested are expected to be different, for example locator pins (such as illustrated at 88 for registering the assembly 46) adapted to pass through cooperating locator holes in the panels 60 of the units 30 to be tested. The contact structures 42 of the fixed matrix associated with the testing equipment are electrically conductive metallic pin members 90, similar to those typically employed in circuit boards of the like where interconnections are to be made by wirewrap techniques, which may be press-fitted through the lower wall 76 of the upper section 40 in an area laterally offset from the aperture 78. Each of the pins 90 is wirewrap connected with a corresponding lead 92 of the adaptor cable 44, which is passed through a side wall of the upper section 40 via an air-tight coupling 94 from which a multi-conductor cable stretch 96 leads to the circuit analyser or other testing equipment and is adapted for coupling with the terminals of the latter. In the preferred construction, there will be a pin 90 for each terminal of the testing equipment being used, and the pins 90 are regularly arranged at the intersection points of a rectangular grid with uniform spacings between the pins 90 of about 1/10 inch in each direction. The pins 90 are shown as including heads 98 at their lower ends to present the surfaces to be engagingly contacted by the contacting structures 52 in effecting electrical connections therebetween, and the upper ends of the contacting structures 52 are shown as rounded: however, pins for use as the contact structures 42 and as the contacting structures 50 and 52 are commonly available or may be easily fabricated with various end surface configurations including spherically or conically convex or concave ends which may then be employed in suitable combinations of mating surfaces to assure appropriate final alignment during interengagement thereof.

The plate 48 of the interfacing assembly 46 will usually be rectangular and may be formed of any suitable electrically insulative material, such as the plastic products commercially available under the trade designations "G10" or "Lexan", and is provided with an elongate hole 100 for reciprocably receiving each of the contacting structures 52 and an elongate hole 102 for reciprocably receiving each of the contacting structures 50. The holes 100 are, of course, arranged at the intersections of a regular grid pattern identical to that employed for the pins 90 of the contact structures 42 in order to assure respective alignment of the contacting structures 52 with the latter, while the holes 102 are arranged in a typically irregular pattern matched with the locations of the test points of the unit 30 to be tested presented by the contact structures 32 of the latter. It may be observed, therefore, that the regular matrix-like arrangement of the holes 100 may be identical for all interfacing board assemblies 46 to be employed in a given fixture 34 for simplicity in fabricating the plates 48 (although not every hole 100 will necessarily be provided with a contacting structure 52, as hereinafter explained), while the arrangement of the holes 102 will differ in particular assemblies 46 depending upon the arrangement of the test point structures 32 in the type of units 30 with which each such assembly 46 is to be used. The plate 48 of the assembly 46 is releasably supported within the lower section 38 as upon inwardly extending ledges 104 and proper registry thereof is accomplished in any suitable fashion, as by locator pins 88 on the ledges 104 for registering with corresponding locating holes 106 in the plate 48. The contacting structures 50 and 52 are respectively provided by pin elements 108 and 110, which are elongate, electrically conductive and substantially rigid or non-compressible and may be obtained or formed from materials and in fashion similar to that for the pins 90, and in the embodiment of FIG. 3 the pins 108 may be understood as having concave upper ends for optimum engagement with the contact structures 32 of the particular board 30 shown for illustrative purposes. The upper engaging ends of the pins 108 and 110 may be plated with a noble metal to preserve and enhance the electrical conductivity of the engaging surface thereof, and the pins 90 may be similarly treated for optimizing the electrical conductivity of the surface thereof to be engaged. It will be understood that, although there preferably will be a contact structure 42 for each terminal of the testing equipment to be employed, there will typically be an equal and lesser number of pins 108 and 110, depending upon the particular type of units 30 with which a given assembly 46 is to be used, since there is no need to provide a greater number of pins 108 and 110 than there are contact structures 32 on the particular type of unit 30 to be tested with such assembly 46. Each of the pins 108 is electrically connected with a logically corresponding pin 110 by means of a respective electrically conductive lead 112 wirewrap connected to the corresponding pin 108 as at 114 and wirewrap connected to the corresponding pin 110 as at 116. The leads 112 should be sufficiently flexible so as not to materially interfere with the reciprocable movement of the corresponding pins 108 and 110. The leads 112 and wirewrap connections 114 and 116 are located in the preferred embodiment at the lower side of the assembly 46 between the plate 48 and the diaphragm 54 for convenience in fabricating the assembly 46, but could, if desired, be disposed on the other or upper side of the plate 48. It should be noted that, since the pins 108 and 110 are relatively loosely received within the holes 102 and 100 to permit free reciprocal movement thereof, until the wirewrap connections 114 and 116 are made, the pins 108 and 110 would also be rotatable; accordingly, in order to facilitate the making of the wirewrap connections 114 and 116, each of the pins 108 and 110 will be provided with a small laterally extending tang or projection as at 118 (only one of same being illustrated) located at a zone of the pin 108 or 110 to be disposed on the side of the plate 48 opposite from that where the wirewrap connection 114 or 116 is to be made. Such projections 118 serve to restrain the pins 108 and 110 against rotation during the making of the wirewrap connections 114 and 116 thereto and also serve the secondary purpose of then restraining the pins 108 and 110 from dropping out of the plate 48. The wirewrap connections 114 and 116 may be made in any conventional fashion, either manually or by means of an appropriately programmed automatic wirewrapping machine. As will be apparent, each assembly 46 thus serves to provide a respective electrical connection between each contact structure 32 of a unit 30 under test and a logically corresponding contact structure 42 associated with the testing equipment, via the contacting structures 50, the leads 112 and the contacting structures 52 when the contacting structures 50 and 52 are respectively engaged with the contact structures 32 and 42.

The diaphragm 54 may be formed of any suitable material, such as a sheet of the plastic product commercially known as "Neoprene", mounted, in the embodiment of FIG. 3, in spanning relationship to an aperture 120 in the bottom of the lower housing section 38. The diaphragm 54 is normally disposed so as to be engaged by the lower ends of the pins 108 and 110, and the latter are preferably flat or slightly convexly rounded to prevent undue wear upon the diaphragm 54. The diaphragm 54 is preferably somewhat resilient so as to have a normal disposition in the absence of a fluid pressure differential thereacross that will permit the pins 108 and 110 to drop by the action of gravity to levels out of engagement with the contact structures 32 and 42, and the diaphragm 54 must, of course, be sufficiently flexible to shift or distort under the influence of a fluid pressure differential for reciprocating the pins 108 and 110 into engagement with the contact structures 32 and 42 in the manner hereinafter disclosed. The face of the diaphragm 54 within the zone 74 of the embodiment of FIG. 3 simply communicates with the atmosphere and is subjected to the ambient pressure of the latter.

The means 56 for creating a differential fluid across the diaphragm 54 in the embodiment of FIG. 3 comprises any suitable source for generating a vacuum or sub-atmospheric pressure, as represented by the arrow 122, which may be coupled via a control valve 124 and a conduit 126 with the interior zone 72 of the housing 36 and thereby the upper surface of the diaphragm 54. When the fluid pressure within internal zone 72 is lowered below the atmospheric or other pressure within the exterior zone 74, a fluid pressure differential is created across the diaphragm 54, and the excess of pressure in the zone 74 serves to move or distort the various areas of the diaphragm 54 below the pins 108 and 110 inwardly toward the zone 72, which is upwardly in the illustrated embodiment, thereby reciprocably and independently shifting each of the pins 108 and 110 into engagement with the corresponding contact structures 32 or 42. Since a fluid pressure upon a wall confining the same, in this instance the lower surface of the diaphragm 54, exerts equal forces upon every portion of such wall surface and does so in a direction perpendicularly to each wall surface portion to which such pressure is applied, it is believed clear that, when the pressure within the zone 72 is lowered with respect to the pressure in the zone 74, the diaphragm 54 will function to urge each individual pin 108 and 110 into substantially equally forceful respective engagement with the corresponding contact structure 32 or 42, even though the extent of reciprocal movement of the various pins 108 and 110 may be different to accommodate for lack of co-planarity of the lower ends of the contact structures 32 and 42.

Illustrative Alternate Embodiments

The apparatus 134 depicted in FIG. 4 teaches an alternate embodiment which might actually be preferred by some persons desiring to utilize controlled fluid pressure rather than a vacuum for operating the same. The construction of the apparatus 134 is in most respects entirely similar to that disclosed in connection with the preferred illustrative embodiment of FIG. 3, so that similar parts identified by like reference numerals will be understood as the same and the reiteration of description thereof may be omitted. Accordingly, only those aspects of the apparatus 134 which do differ from the apparatus 34 will next be discussed. In general, the apparatus 134 is intended to have the diaphragm 54 actuated by a fluid pressure differential thereacross created by providing an enclosed chamber 174 beneath the diaphragm 54, subjecting such chamber 174 to a controlled, positive fluid pressure, and, if desired, maintaining the zone 72 above the diaphragm 54 at atmospheric or other lower pressures. To this end, the lower section 38 may be provided with a vent hole 128 communicating the interior zone 72 of the fixture 36 to the atmosphere (or, conceivably, to a source of vacuum or fixed fluid pressure, if desired), the bottom of the lower housing section 38 beneath the diaphragm 54 is closed by a wall 130 to confine the enclosed chamber 174, and the means 156 for controllably introducing a higher or positive fluid pressure into the chamber 174 would be a source of gas (or, conceivably, liquid) under pressure represented by the arrow 132 communicated through a control valve 124 and a conduit 126 with the chamber 174. The pressure source 132 might be any suitable air-compressing and storage equipment, just as the vacuum source 122 of the apparatus 134 may be provided by any conventional vacuum pump or other vacuum producing system.

The operation of the apparatus 134 differs from that of the apparatus 34 only in the manner in which the fluid pressure differential across the diaphragm 54 is created, and the action of the diaphragm 54 in reciprocating the pins 108 and 110 and the respective, equally forceful engagements with the contact structures 32 and 42 is essentially the same.

Although the controlled creation of the required fluid pressure differential for operating the diaphragm 54 may in most environments and applications be most conveniently achieved through the employment of either a vacuum source 56 or a positive fluid pressure source 156, the apparatus 234 of FIG. 5 is intended to illustrate still another alternative which might be desirable for use in some particular enviroments. Again, the apparatus 234 is, in most respects, similar to the apparatus 34, so that like parts are identified by the same reference numerals, and only differing aspects of the apparatus 234 will be discussed. In general, the apparatus 234 depicted in FIG. 5 contemplates that the required fluid pressure differential across the diaphragm 54 will be produced by shifting a closed chamber 274 of which the diaphragm comprises the upper confining wall toward and away from the lower ends of the pins 108 and 110 in such manner that the pins 108 and 110, upon engagement with the contact structures 32 and 42, will exert downward forces upon the diaphragm 54, thereby shifting or distorting the latter inwardly toward the chamber 274, which in turn produces or increases the positive pressure of fluid confined within the chamber 274 with respect to the pressure within the zone 272 above the diaphragm 54, which may be vented to the atmosphere. To this end, the zone 272 within the interior of the fixture 36 is vented to the atmosphere via an opening 228 in the lower housing section 38, and the bottom of the latter is open to receive a fluid container 200 including wall structure 202 and the diaphragm 54 for controlled reciprocation toward and away from the lower ends of the pins 108 and 110. Preferably, some suitable predetermined fluid pressure of gas (or liquid) will be established within the chamber 274 through introduction of fluid thereto through a conduit 204 provided with a valve 206 which may be closed once the desired pressure within the chamber 274 has been established. Controlled reciprocable movement of the container 200 may be induced by any suitable mechanical, hydraulic or other means generally designated 208 physically coupled with the container through suitable, controllable conventional linkages or couplings indicated by the dotted line 210. As previously indicated, upon the container 200 being shifted upwardly so that the diaphragm 54 reciprocates the pins 108 and 110 into engagement with the contact structures 32 and 42, the reaction forces of the lower ends of the pins 108 and 110 upon the upper surface of the diaphragm 54 will tend to cause the yieldable diaphragm 54 to move or distort inwardly toward the chamber 274, thereby increasing the fluid pressure within the latter to a level in excess of the fluid pressure within the zone 272, which in turn creates the fluid pressure differential needed to assure that the diaphragm 54 will urge each of the pins 108 and 110 into respective engagements with the corresponding contact structures 32 and 42 with substantially equal forces. It should be observed that the initial fluid pressure within the chamber 274 may be merely approximately equivalent to ambient atmospheric pressure when the zone 272 is vented to the atmosphere, but it is preferred that the chamber 274 be closed during operation in order to take advantage of the force equalizing characteristics of the diaphragm 54 when subjected to a relatively positive fluid pressure upon its lower face, since the action normally will provide a significantly better equalization of the forces of engagement of the various pins 108 and 110, than would be attained, for example, by merely utilizing an elastic diaphragm 54 with no fluid pressure differential thereacross.

Although the fluid pressure differential to be utilized with the apparatus 34, 134 or 234 may be selected for the particular circumstances involved, only moderate level vacuums or relatively low pressures or limited mechanical forces are required for the testing of typical printed circuit board units 30 with the apparatuses 34, 134 and 234 respectively, a general guide being that an engagement force at a level somewhere in the range of about 2–8 ounces for each of the pin elements 108 and 110 should be adequate in most instances.

General Scope of the Invention

As should be clear to those skilled in the art from the apparatuses 34, 134 and 234 herein depicted and described as illustrating the principles of the invention as applied for one exemplary purpose in effecting substantially equal forceful, engagement-type, electrical connections with relatively numerous and closely spaced electrical contact structures, the invention is well suited for accomplishing its objectives in that regard in a markedly improved fashion as compared with earlier equipment available and conventionally used for the same purpose. It should be further apparent, however, that the novel principles of the invention, including the way in which it provides for equally forceful manipulation of a plurality of permissably densely arranged reciprocable elements responsive to the action of a yieldable diaphragm to which a fluid pressure differential is applied, may well have considerable utility in diverse other applications. It will be similarly manifest that the details of construction of the embodiments disclosed for illustrative purposes may be altered in numerous respects without departing from the principles of the invention or its essence and the kernel of its novelty; as one example, it should be clear that the general arrangment of parts could, with only relatively minor modifications, be inverted or oriented in fashion other than depicted herein for illustrative purposes.

Accordingly, it is to be understood that the invention should be deemed limited only by the fair scope of the claims which follow, including constructions reasonably regardable as constituting mechanical equivalents thereof.

I claim:

1. In electrical interfacing apparatus for effecting concurrent, separate, electrical connections between respective ones of a plurality of individually engageable, electrically conductive, contact structures arranged in a first predetermined pattern of generally co-planar character in which some of said contact structures may be displaced in either direction from precise co-planarity with other of said contact structures and respectively corresponding ones of a plurality of individually engageable, electrically conductive, contact members arranged in a second predetermined pattern of generally co-planar character in which some of said contact members may be displaced in either direction from precise co-planarity with other of said contact members, wherein said connections to be effected preferably involve substantially equally forceful, respective engagements with each of said contact structures and each of said contact members:

means for supporting said contact structures in a first spatial zone;

means for supporting said contact members in said first zone with said pattern of contact members offset generally laterally from said pattern of contact structures and with the plane of general co-planarity of said pattern of contact members being substantially parallel to the plane of general co-planarity of said pattern of contact structures;

shiftable, electrically conductive, contacting structures within said first zone for each of said contact structures respectively, each of said contacting structures having a force-receiving portion and an engaging portion, the engaging portion of each of said contacting structures being disposed adjacent the corresponding contact structure for engaging the latter when a force is applied to said force-receiving portion thereof;

shiftable, electrically conductive, contacting elements within said first zone for each of said contact members respectively, each of said contacting elements having a force-receiving portion and an engaging portion, the engaging portion of each of said contacting elements being disposed adjacent the corresponding contact member for engaging the latter when a force is applied to said force-receiving portion thereof;

fluid barrier means for separating said first zone from a second spatial zone, said barrier means including yieldable diaphragm means having areas respectively adjacent to each of said force-receiving portions of said contacting structures and said contacting elements, said areas being sufficiently flexible to be displaceable toward said first zone and respectively operable for forcefully engaging the force-receiving portion of the corresponding contacting structures and contacting members with substantially equal forces in response to a fluid pressure differential between said first and second zones involving a relatively greater pressure in said second zone than in said first zone;

means for creating a fluid pressure differential between said first and second zones involving a relatively greater fluid pressure in said second zone than in said first zone; and means for electrically coupling each of said contacting structures with a corresponding one of said contacting elements.

2. Apparatus according to claim 1, wherein said contacting structures and said contacting elements comprise:

a plurality of substantially parallel, elongate, metallic pins supported for independent longitudinal movement.

3. Apparatus according to claim 2, wherein said coupling means comprises:

a lead oppositely wirewrap connected with each of said contacting structures and a corresponding one of said contacting elements.

4. Apparatus according to claim 2, wherein said diaphragm means comprises:

a single sheet of substantially flexible, electrically insulative material having sufficient resilience to normally extend in substantially planar facing relationship to the planes of general co-planarity of said contact structures and said contact members.

5. Apparatus according to claim 1, wherein said pressure differential creating means includes:

means for enclosing said first zone; and means for removing fluid from said first zone.

6. Apparatus according to claim 1, wherein said pressure differential creating means includes:

means for enclosing said second zone; and means for introducing fluid into said second zone.

7. Apparatus according to claim 1, wherein said pressure differential creating means includes:

means for enclosing said second zone;

a quantity of fluid confined in said second zone at an initial pressure at least substantially as great as the fluid pressure within said first zone; and means for shifting one of said diaphragm means and said combination of contacting structures and contacting elements relative to the other to move said areas of said diaphragm means into forceful engagement with said contacting structures and said contacting elements thereby increasing the pressure within said second zone in response to displacement of said areas toward said second zone by said engagement.

* * * * *